(12) United States Patent
Choi

(10) Patent No.: US 6,211,707 B1
(45) Date of Patent: Apr. 3, 2001

(54) OUTPUT BUFFER CIRCUIT WITH PRESET FUNCTION

(75) Inventor: Jae Seung Choi, Kyoungki-do (KR)

(73) Assignee: Hyundai Electronics Industries Co, Ltd., Kyoungki-do (KR)

( * ) Notice: Subject to any disclaimer, the term of this patent is extended or adjusted under 35 U.S.C. 154(b) by 0 days.

(21) Appl. No.: 09/474,553

(22) Filed: Dec. 29, 1999

(30) Foreign Application Priority Data

Dec. 30, 1998 (KR) .................................................. 98-61836

(51) Int. Cl.[7] ...................................................... H03B 1/00
(52) U.S. Cl. ............................ 327/112; 327/374; 327/384
(58) Field of Search ................................... 327/108, 109, 327/112, 374, 375, 379, 384, 391; 326/17, 20, 21, 22, 23, 24, 25, 26, 27

(56) References Cited

U.S. PATENT DOCUMENTS

| | | | |
|---|---|---|---|
| 4,963,774 | 10/1990 | Masuda | 327/437 |
| 5,124,577 | * 6/1992 | Davis et al. | 327/374 |
| 5,153,457 | * 10/1992 | Martin et al. | 326/84 |
| 5,214,609 | 5/1993 | Kato et al. | 365/230 |
| 5,559,465 | * 9/1996 | Shah | 327/374 |
| 5,619,151 | 4/1997 | Akioka et al. | 327/78 |
| 5,808,953 | 9/1998 | Kim et al. | 365/226 |
| 5,877,651 | 3/1999 | Furutani | 327/538 |
| 6,130,563 | * 10/2000 | Pilling et al. | 327/112 |

FOREIGN PATENT DOCUMENTS 4092464    3/1992 (JP) .

* cited by examiner

Primary Examiner—Kenneth B. Wells
Assistant Examiner—Paul Dinh
(74) Attorney, Agent, or Firm—Finnegan, Henderson, Farabow, Garrett & Dunner, L.L.P.

(57) ABSTRACT

A data output buffer having an input pad and an output pad, comprising: output driver means for buffering an output of a sense amplifier through the input pad and providing it to the output pad in accordance with a control signal, the output driver means including a pull up driver and a pull down driver; voltage level detection means for receiving data fed back from the output pad and comparing the data and a reference voltage level in accordance with the control signal and a chip select signal; preset signal generation means for receiving the control signal to control an output driver control means; and the output driver control means for receiving output signals received from the voltage level detection means and the preset signal generation means to control the output driver means.

11 Claims, 5 Drawing Sheets

OUTPUT BUFFER CIRCUIT WITH PRESET FUNCTION

BACKGROUND OF THE INVENTION

This invention relates to an output buffer circuit in a semiconductor memory device, and more particularly to an output buffer circuit with a preset function for precharging a voltage level of an output pad at a constant level before the next output signal is provided to the output pad to improve data access speed and to reduce noise.

An output buffer circuit in a semiconductor memory device outputs an output signal from a sense amplifier to an output pad and the prior output buffer circuit is shown in FIG. 1. Referring to FIG. 1, the prior output buffer circuit includes a first two-input NAND gate 11 receiving a control signal poe which is an enable signal as a first input signal and an input signal sj from a sense amplifier (not shown) as a second input signal to generate a pull up driving signal dp; a first inverting gate 12 for inverting the input signal sj; a second two-input NAND gate 13 receiving an output signal of the first inventing gate 12 as a first input signal and the control signal poe as a second signal; a second inverting gate 14 for inverting an output signal of the second NAND 12 to generate a pull down driving signal dn; a PMOS transistor 15 being driven by the pull up driving signal dp from the first NAND gate 11; and a NMOS transistor 16 being driven by the pull down driving signal dn. The output buffer circuit generates an output signal out through drains of the PMOS transistor 15 and the NMOS transistor 16 which are commonly connected to each other.

Hereinafter, the operation of the output buffer circuit in FIG.1 will be described with reference to FIG. 2A to FIG. 2C in more detail. If the control signal poe, that is an enable signal is a high state as shown in FIG. 2A, the output buffer circuit is enabled and the level of the output node OUT is determined in accordance with a logic state of the input signal sj. That is, if the input signal sj is a high state, the pull up driving signal dp and the pull down driving signal dn become all low states. The pull up transistor, the PMOS transistor 15 is turned on and the pull down transistor, the NMOS transistor 16 is turned off, so that the output node becomes a high state. If the input signal sj is a low state as shown in FIG. 2b, the pull up driving signal dp and the pull down driving signal dn are all high states. The PMOS transistor 15 is turned off and the NMOS transistor 16 is turned on, so that the output node OUT becomes a low state as shown in FIG. 2C.

On the contrary, if the control signal poe is a low state as shown in FIG. 2A, the output buffer circuit is disabled. If the output buffer circuit becomes disabled, the pull up driving signal becomes a high state and the pull down driving signal becomes a low state. The PMOS transistor 15 and the NMOS transistor 16 are turned off and the output node is floating and then is transited into a high impedance as shown in FIG. 2C.

However, when the capacitance of a load capacitor in the output node is large, next data is generated before the output node is transited into a high impedance and the time for charging and discharging the load capacitor is required so that the access time is increased. Accordingly, the swing of the output signal becomes large to increase current noise.

SUMMARY OF THE INVENTION

It is an object of the present invention to provide a data output buffer for reducing a data access time and noise by precharging an output node to a constant level in disable.

There is provided to a data output buffer having an input pad and an output pad, comprising: output driver means for buffering an output of a sense amplifier through the input pad and providing it to the output pad in accordance with a control signal, the output driver means including a pull up driver and a pull down driver; voltage level detection means for receiving data fed back from the output pad and comparing the data and a reference voltage level in accordance with the control signal and a chip select signal; preset signal generation means for receiving the control signal to control an output driver control means; and the output driver control means for receiving output signals from the voltage level detection means and the preset signal generation means to control the output driver means.

The output driver means includes: a pull up/down driver portion for buffering the output signal of the sense amplifier, the pull up/down driver portion including the pull up derive and the pull down driver; and a control portion for controlling the pull up/down driver portion by the control signal. The control portion includes: a first NAND gate for receiving the control signal and the output signal from the sense amplifier; and a first inverting gate for inverting an output signal of the first NAND gate; a second inverting gate for inverting the output signal from the sense amplifier; and a second NAND gate for receiving an output signal of the second inverting gate and the control signal. The pull up/down driver portion includes a PMOS transistor and a NMOS transistor, respectively.

The voltage level detection means includes: an output voltage detection portion for receiving the data fed back from the output pad to generate a voltage level detection signal to the output driver control means; and a control portion for controlling the output voltage detection portion for receiving the chip selection signal and the control signal to enable the output voltage detection portion when the data output buffer is disabled.

The control portion for controlling the output voltage detection portion includes: a NOR gate for receiving the control signal and the chip selection signal; and a first inverting gate for inverting an output signal of the NOR gate.

The output voltage detection portion includes; a first PMOS transistor where the output pad is connected to a source and an output signal of the first inverting gate is applied to a gate; a second PMOS transistor where a drain of the first PMOS transistor is connected to a source; a resistor where one terminal is connected to a gate and a drain of the second PMOS transistor and another terminal is grounded; a second inverting gate for receiving a voltage divided by the resistor and the first and second PMOS transistors to generate the voltage level detection signal; and a condenser being connected between an output of the second inverting gate and a ground.

The preset signal generation means includes: first delay means for delaying the control signal for a first selected time when the control signal becomes a first voltage level; second delay means for delaying the control signal for a second selected time longer than the first time to generate an inverted delayed control signal when the control signal becomes a first voltage level before it becomes a second level; and a NOR gate for receiving output signals from the first and second delay means to generate a logic-NORed edge signal.

The output driver control means includes: a pull up driver control portion for controlling the pull up driver to supply a power voltage to the output pad during a pulse of the output signal generated from the preset signal generation means, if the voltage level of the output pad detected through the voltage level detection means, is lower than the reference voltage level when the output buffer is disabled; and a pull down driver control portion for controlling the pull down driver to supply a ground voltage to the output pad during the pulse generated from the preset signal generation means, if the voltage level of the output pad detected through the voltage level detection means, is higher than the reference voltage level when the output buffer is disabled. The pull up driver control portion includes; a first NAND gate for receiving the output signals from the voltage level detection means and the preset signal generation means; a first inverting gate for inverting an output signal of the first NAND gate; and a NOR gate for receiving output signals from the first inverting gate and the pull up/down driver portion in the output driver means to generate a pull up driving signal to the control portion of the output driver means. The pull down driver portion includes: a second inverting gate for inverting the output signal from the voltage level detection means; a second NAND gate for receiving output signals from the second inverting gate and the preset signal generation means; and a third NAND gate for receiving output signals from the second NAND gate and the pull up/down driver portion in the output driver means to generate a pull down driving signal to the control portion of the output driver means.

BRIEF DESCRIPTION OF DRAWINGS

The objects and features of the invention may be understood with reference to the following detailed description of an illustrative embodiment of the invention, taken together with the accompanying drawings in which.

DETAILED DESCRIPTION OF THE INVENTION

Figure 3:
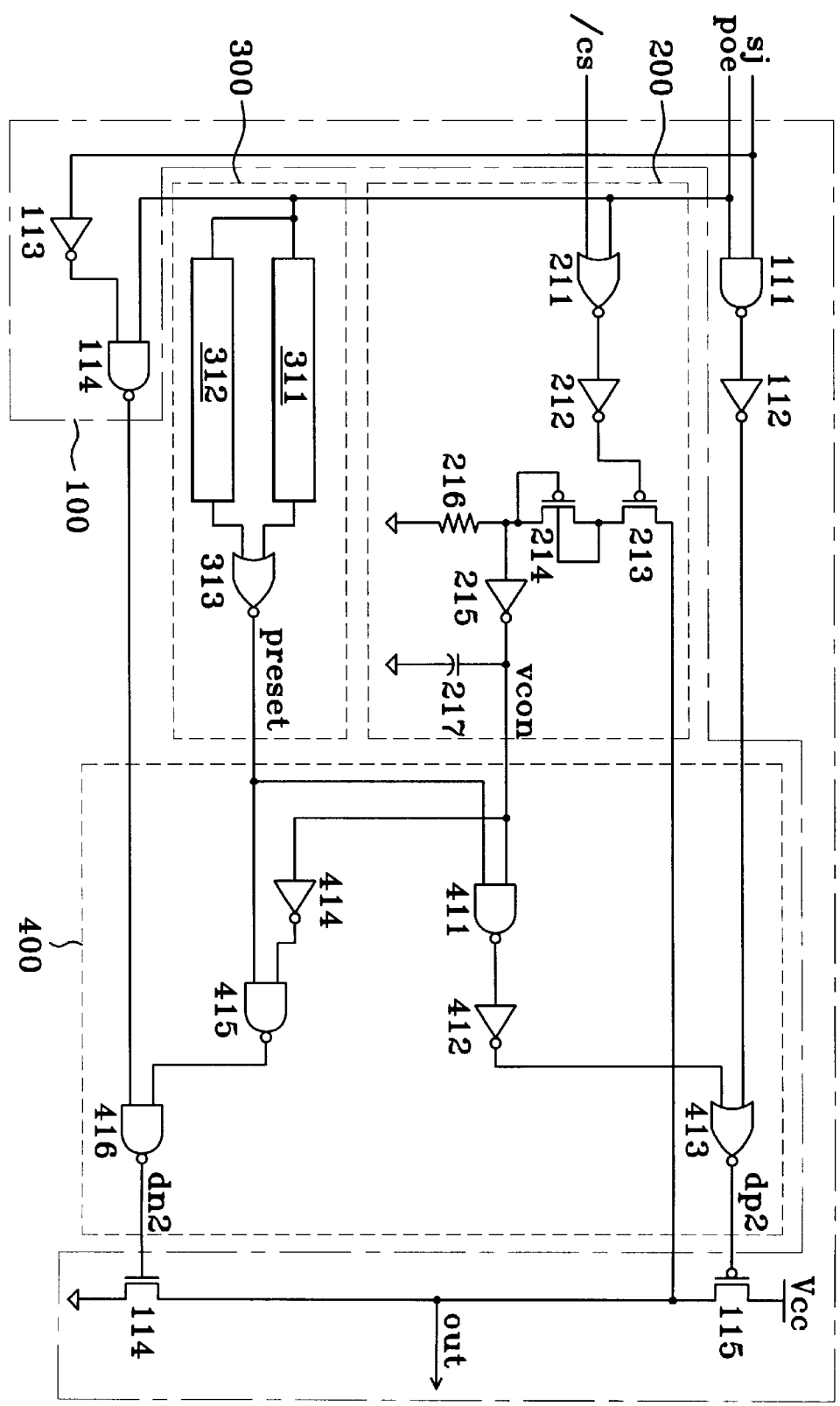
FIG. 3 is a circuit diagram of an output buffer with a preset function in accordance with an embodiment of the present invention.

FIG. 3 shows a circuit diagram of an output buffer in accordance with an embodiment of the present invention. Referring to FIG. 3, the output buffer circuit of the present invention includes a buffer portion 100 for buffering an input signal sj received from a sense amplifier (not shown) to provide it to an output node out in accordance with a control signal poe which is an output enable signal; a voltage level detection portion 200 for detecting a voltage level of the output node out in accordance with the output enable signal poe and a chip select signal /cs; a preset signal generation portion 300 receiving the output enable signal poe to generate a preset signal; and a control portion 400 receiving a preset signal from the preset signal generation portion 300 and a voltage detection signal vcon from the voltage level detection portion 200 to generate a pull up driving signal dp2 and a pull down driving signal dn2 for driving a PMOS transistor 115 and a NMOS transistor 116 of the buffer portion 100, respectively.

The buffer portion 100 includes a first means for buffering the input signal sj by the output enable signal poe and a second means for driving the output node OUT. The first means of the buffer portion 100 includes a first two-input NAND gate 111 for receiving the output enable signal poe and the input signal sj from a sense amplifier; a first inverting gate 112 for inverting an output signal of the first NAND gate 111; a second inverting gate 113 for inverting the input signal sj; and a second two-input NAND gate 114 for receiving the output enable signal poe and an output signal of the second inverting gate 113. The second means of the buffer portion 100 includes a first PMOS transistor 115 for pull up and a first NMOS transistor 116 for pull down which are serially connected between a power voltage and a ground and drains thereof commonly connected are connected to the output node out.

The voltage level detection portion 200 includes a first means for detecting a voltage level of the output node out and a second means for receiving the chip selection signal /cs and the output enable signal poe to enable the first means. The second means of the voltage level detection portion 200 includes a first two-input NOR gate 211 receiving the output enable signal poe and the chip selection signal /cs as two input signals and a third inverting gate 212 for inverting an output signal of the first NOR gate 211.

The first means of the voltage level detection portion 200 includes a second PMOS transistor 213 where a source is connected to the output node and an output signal of the third inverting gate 212 is applied to a gate; a third PMOS transistor 214 where a source is connected to a drain of the second PMOS transistor 213; a resistor 216 which one terminal is connected to a gate and a drain of the third PMOS transistor 214 and another terminal is connected to a ground; a fourth inverting gate 215 being connected to the one terminal of the resistor 216 and the drain of the third PMOS transistor 213 to generate the voltage level detection signal vcon; and a condenser 217 connected between an output of the fourth inverting gate 215 and a ground.

The preset signal generation portion 300 includes a first delay means 311 for delaying the output enable signal poe during a first time interval; a second delay means 312 for delaying the output enable signal poe during a second time interval; and a second two-input NOR gate 313 for receiving output signals from the first and second delay means.

The control portion 400 includes a first means for receiving the voltage level detection signal vcon from the voltage level detection portion 200, the preset signal preset from the preset signal generation portion 300 and the output signal from the first means of the buffer portion 100 to generate a pull up driving signal dp2 for driving the PMOS transistor 115 in the second means of the buffer portion 100 and a second means for receiving the voltage level detection signal vcon from the voltage level detection portion 200, the preset signal from the preset signal generation portion 300 and the output signal from the second means of the buffer portion 100 to generate a pull down driving signal dn2 for driving the first NMOS transistor 116 in the second means of the buffer portion 100.

The first means of the control portion 400 includes a third two-input NAND gate 411 for receiving the voltage level detection signal vcon from the voltage level detection signal 200 and the preset signal from the preset signal generation portion 300; a fifth inverting gate 412 for inverting an output of the third NAND gate 411; and a third two-input NOR gate 413 for receiving an output signal of the fifth inverting gate 412 and an output signal of the first inverting gate 112 in the first means of the buffer portion 100 to generate the pull up driving signal dp2.

The second means of the control portion 400 includes a sixth inverting gate 414 for inverting the voltage level detection signal vcon; a fourth two-input NAND gate 415 for receiving an output signal of the sixth inverting gate 414 and the preset signal preset from the preset signal generation portion 300; and a fifth two-input NAND gate 416 for receiving an output signal of the fourth NAND gate 415 and the output signal of the second NAND gate 114 in the first means of the buffer portion 100 to generate the pull down driving signal dn2 for driving the NMOS transistor 116 in the second means of the buffer portion 100.

Figure 4A:
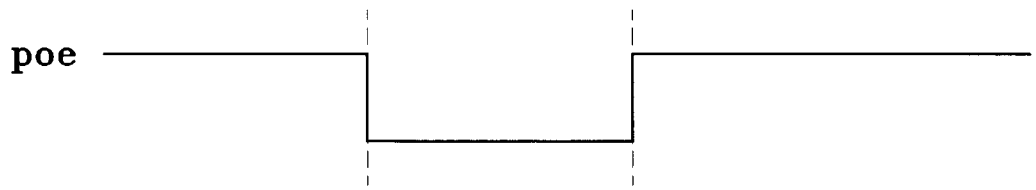
FIG. 4A to FIG. 4D are operation timing diagrams of the output buffer of the present invention in FIG. 3.

Hereinafter, the operation of the output buffer of the present invention will be described with reference to FIG. 4A to FIG. 4D in more detail. As shown in FIG. 4A, if the output enable signal poe is a high state and the output buffer is enabled, the butter portion 100 generates a signal for driving the PMOS transistor 115 of a pull up device through the NAND gate 111 and the inverting gate 112 and a signal for driving the NMOS transistor 116 of a pull down device through the inverting gate 113 and the NAND gate 114 in accordance with the input signal sj received from a sense amplifier.

Figure 4B:

At this time, the input signal sj is a low state as shown in FIG. 4b, the signals of low states are provided to the control portion 400 through the inverting gate 112 and the NAND gate 416, respectively. Accordingly, the control portion 400 generates the pull up driving signal dp2 of a high state and the pull down driving signal dn2 of a high state through the NOR gate 413 and the NAND gate 116, respectively. By the pull up driving signal dp2 of a high state and the pull down driving signal dn2 of a high state, the PMOS transistor 115 is turned off and the NMOS transistor 116 is turned on, so that the output node OUT becomes a low state as shown in FIG. 4d.

At this time, in the voltage level detection portion 200, a high state signal is generated through the NOR gate 211 and the inverting gate 212 and the PMOS transistor 213 is turned off, thereby being disabled.

On the other hand, if the input signal sj is a high state, the signals of high states are generated to the control portion 400 through the inverting gate 112 and the NAND gate 114, respectively and the control portion 400 generates the pull up driving signal dp2 of a low state and a pull down driving signal dn2 of a low state through the NOR gate 413 and the NAND gate 416, respectively. Accordingly, the pull up PMOS transistor 115 is turned on and the pull down NMOS transistor 116 is turned off, so that the output node out becomes a high state.

On the other hand, as shown in FIG. 4a, if the output enable signal poe is a low state, the buffer portion 100 generates the signals of a low state and a high state through the inverting gate 112 and the NAND gate 114. According to this, the control portion 400 generates the pull up driving signal dp2 of a high state through the NOR gate 413 and the pull down driving signal dn2 of a low state through the NAND gate 416. The PMOS transistor 115 and the NMOS transistor 116 are turned off so that the output node out becomes a transition at a high impedance.

At this time, the PMOS transistor 115 and the NMOS transistor 116 are all turned off during a interval T1 by the pull up driving signal dp2 and the pull down driving signal dn2 so as to prevent the current noise by their on/off switching.

The voltage level detection portion 200 generates an enable signal of a low state through the NOR gate 211 for receiving the output enable signal poe and the chip select signal /cs and the inverting gate 212 and the PMOS transistor 213 is turned on so that the voltage level detection portion 200 detects the level of the output node out. The voltage level detection portion 200 generates the voltage level detection signal vcon of a low state or a high state in case where the level of the output node out is higher than or lower than a certain voltage level.

Figure 4C:
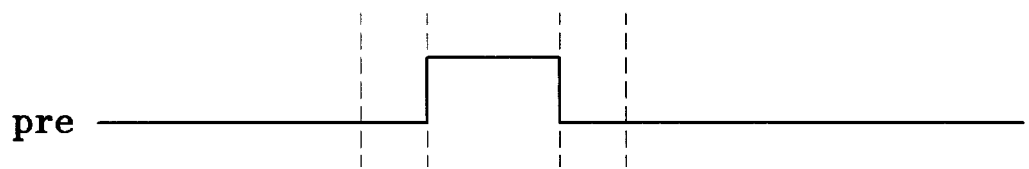
Figure 4D:
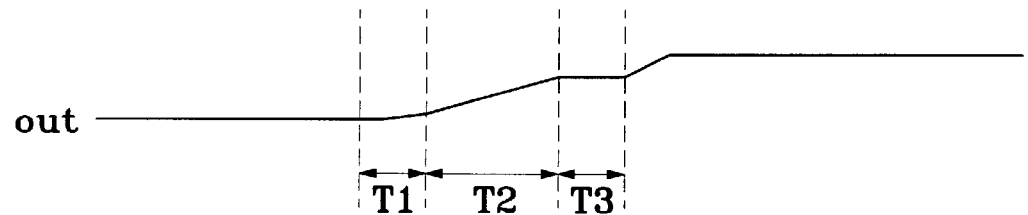

The preset signal generation portion 300 generates the preset signal preset of a high state during a interval T2 as shown in FIG. 4C, when the time for T1 is passed after the output enable signal poe becomes a low state. The control portion 400 receives the preset signal preset from the preset signal generation portion 300 to generate the pull up driving signal dp2 and the pull down driving signal dn2. At this time, if the previous output signal generated through the output node out is a high state, the voltage level detection portion 200 generates the voltage level detection signal vcon of a low state and the control portion 400 generates the pull up driving signal dp2 of a high state and the pull down driving signal dn2 of a high state. Accordingly, the PMOS transistor for pull up 115 is continuously turned off and the NMOS transistor for pull down is also continuously turned on, so that the output node out becomes a transition from the high state to the low state.

Afterwards, if the output node out becomes a certain level, the output signal vcon of the voltage level detection portion 200 becomes a high state and the pull up driving signal and the pull down driving signal become all low state so that the PMOS transistor 115 is turned on and the NMOS transistor 116 is turned off. So as to prevent the output node being continuously a transition leaving a certain level, the present invention connects the condenser 217 to the output stage of the inverting gate 215 to reduce the effect on the voltage level of the output node out.

If a predetermined time for T1+T2 is elapsed after the output enable signal poe becomes a low state, the next interval T3 is an interval before the next data are generated through the output node out and the PMOS transistor 115 for pull up and the NMOS transistor 116 for pull down in the buffer portion 100 are all turned on during the interval T3 as like the interval T1, so that the voltage level detection portion 200 continuously detects the voltage level of the output node out.

Figure 1:
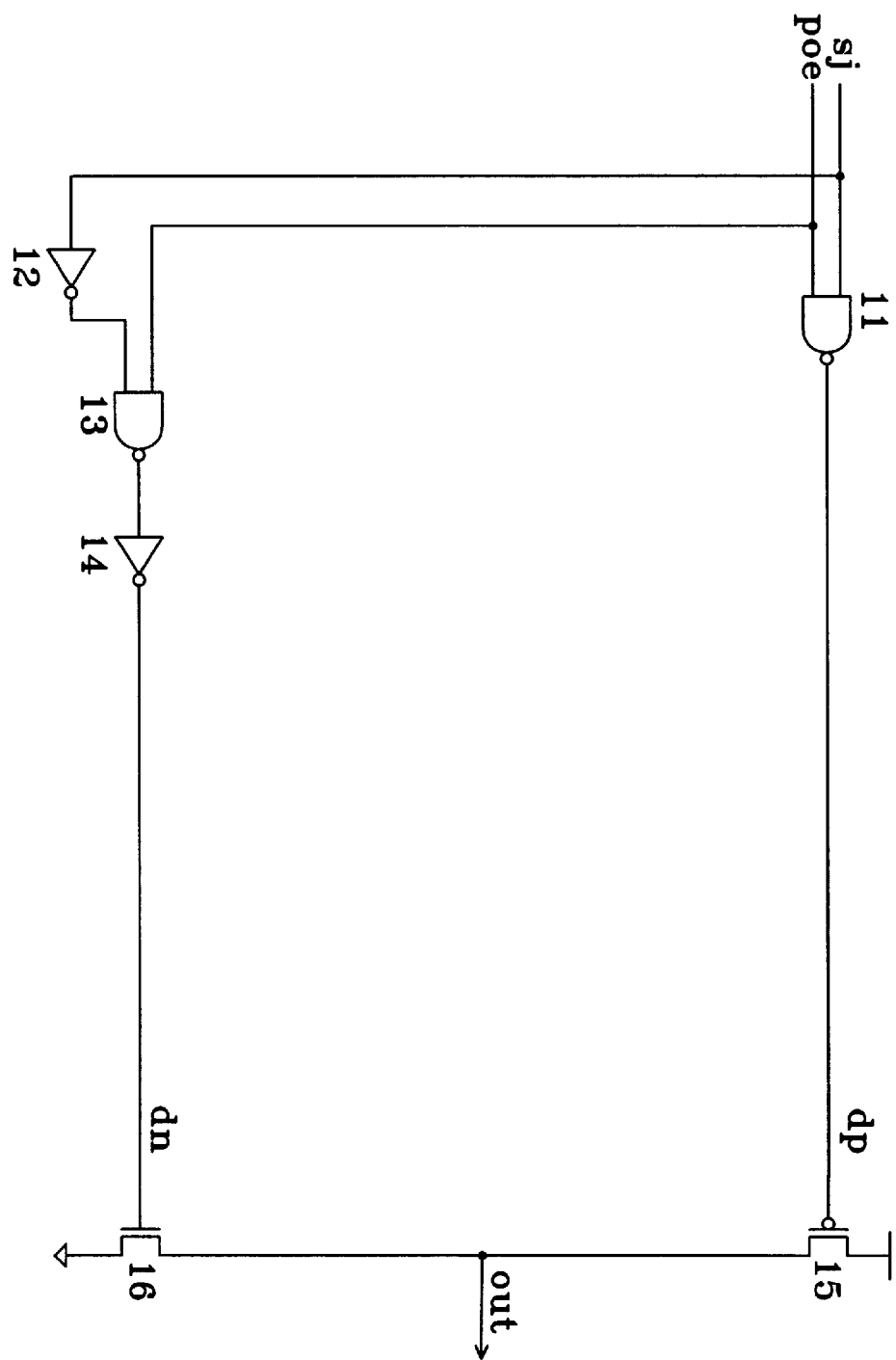
FIG. 1 is a circuit diagram of an output buffer in the prior art.
Figure 2A:
FIG. 2A to FIG. 2C are operation timing diagrams of the output buffer circuit in FIG. 1.
Figure 2B:
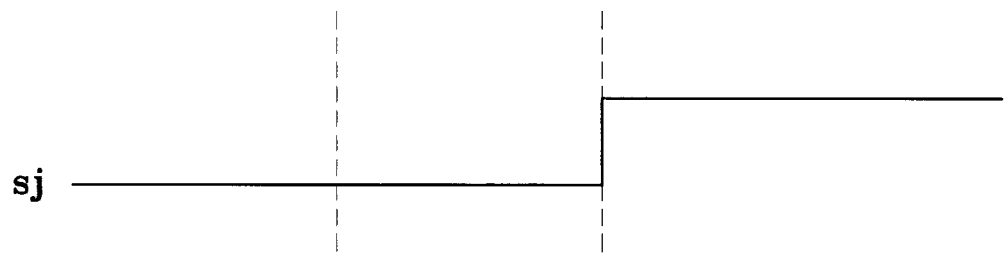
Figure 2C:
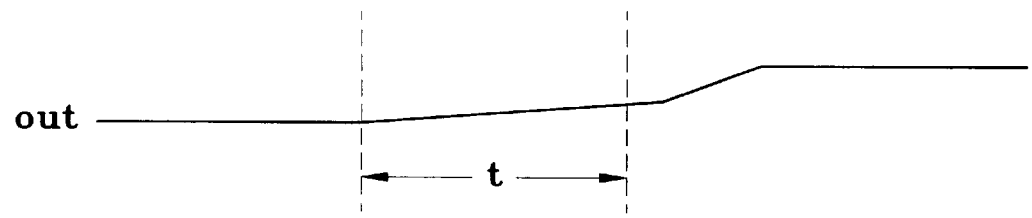
Figure 5:
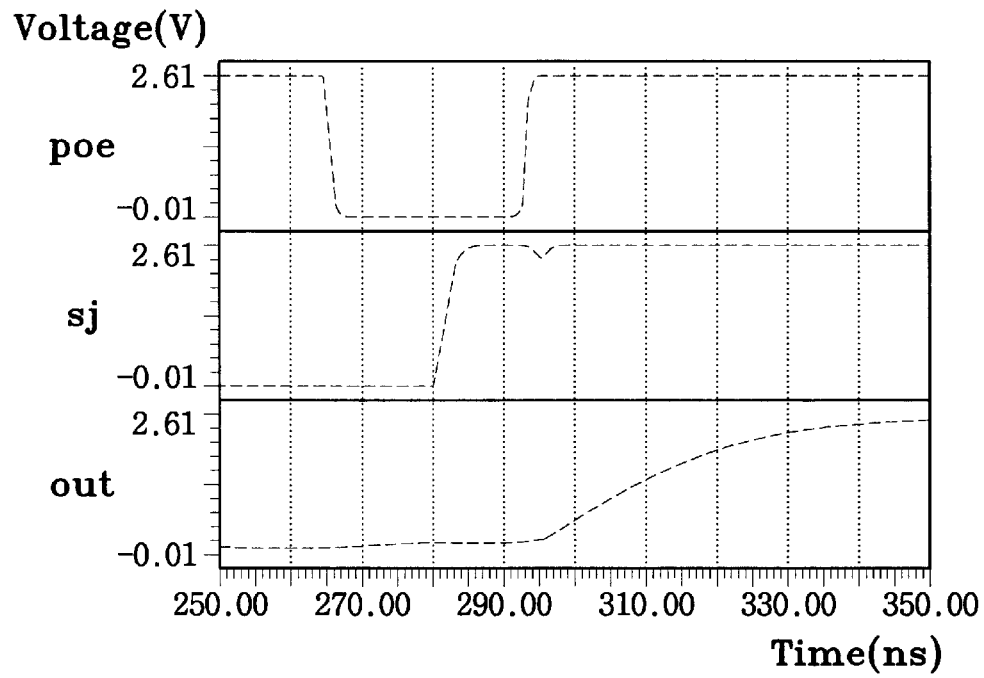
FIG. 5 and FIG. 6 are diagrams illustrating simulation results of the prior output buffer in FIG. 1 and the present output buffer in FIG. 3.
Figure 6:
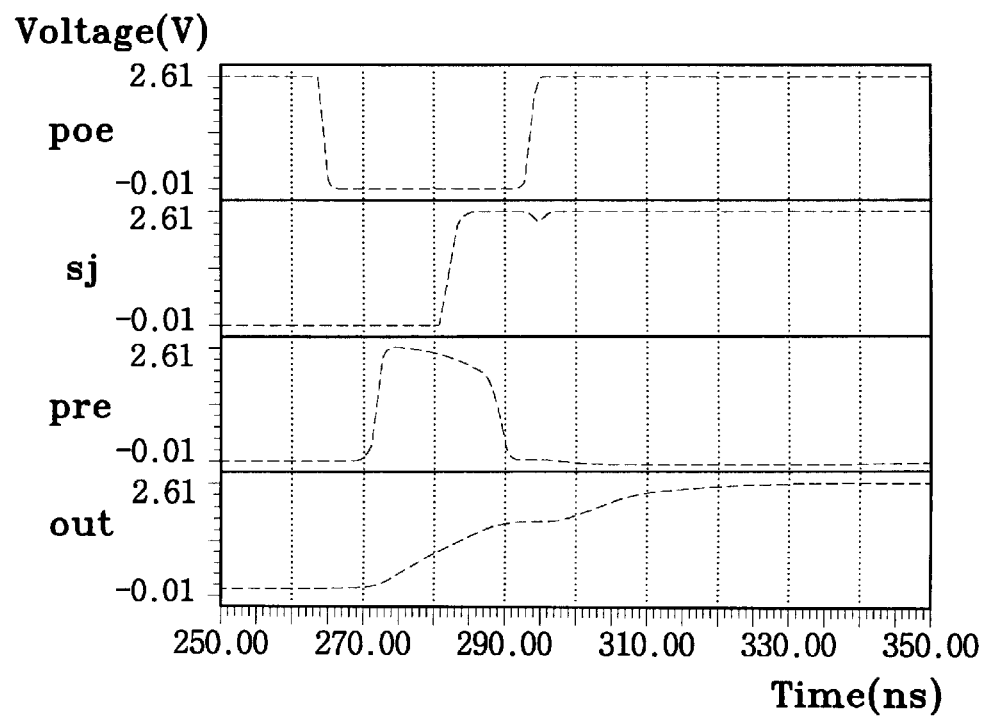

FIG. 5 and FIG. 6 are operation simulation results of the prior output buffer in FIG.1 and the present output buffer in FIG. 3. The data access speeds from the simulation results in FIG. 5 and FIG. 6 are listed in the following table, which are examples in case of the power Vcc of 2.6V and the temperature of 90° C. and the power of 3.4V

|  | 2.6V, 90° C. | 3.4V, −40° C. |
| --- | --- | --- |
| the prior output buffer in FIG. 1 | 65.4ns | 37.0ns |
| the present output buffer in FIG. 3 | 37.7ns | 19.6ns | and the temperature of −40° C.

According to the present invention, when the output buffer is disabled, it preset an output node at a certain level. Accordingly, it can reduce swing of the output node so that it can improve the access speed and reduce the noise.

While the invention has been particularly shown and described with respect to preferred embodiment thereof, it will be understood by those skilled in the art that various changes in form and details may be made therein without departing from the spirit and the scope of the invention as defined by the following claims.

What is claimed is:

1. A data output buffer having an input pad and an output pad, comprising:

output driver means for buffering an output of a sense amplifier through the input pad and providing it to the output pad in accordance with a control signal, the output driver means including a pull up driver and a pull down driver;

voltage level detection means for receiving data fed back from the output pad and comparing the data and a reference voltage level in accordance with the control signal and a chip select signal;

preset signal generation means for receiving the control signal to control an output driver control means; and the output driver control means for receiving output signals received from the voltage level detection means and the preset signal generation means to control the output driver means.

2. The data output buffer as claimed in claim 1, wherein the output driver means includes:

a pull up/down driver portion for buffering the output signal of the sense amplifier, the pull up/down driver portion including the pull up driver and the pull down driver; and a control portion for controlling the pull up/down driver portion by the control signal.

3. The data output buffer as claimed in claim 2, wherein the control portion includes:

a first NAND gate for receiving the control signal and the output signal from the sense amplifier; and a first inverting gate for inverting an output signal of the first NAND gate;

a second inverting gate for inverting the output signal from the sense amplifier; and a second NAND gate for receiving an output signal of the second inverting gate and the control signal.

4. The data output buffer as claimed in claim 1, wherein the pull up/down driver portion includes a PMOS transistor and a NMOS transistor, respectively.

5. The data output buffer as claimed in claim 1, wherein the voltage level detection means includes:

an output voltage detection portion for receiving the data fed back from the output pad to generate a voltage level detection signal to the output driver control means; and a control portion for controlling the output voltage detection portion for receiving the chip selection signal and the control signal to enable the output voltage detection portion when the data output buffer is disabled.

6. The data output buffer as claimed in claim 5, wherein the control portion for controlling the output voltage detection portion includes:

a NOR gate for receiving the control signal and the chip selection signal; and a first inverting gate for inverting an output signal of the NOR gate.

7. The data output buffer as claimed in claim 6, wherein the output voltage detection portion includes;

a first PMOS transistor where the output pad is connected to a source and an output signal of the first inverting gate is applied to a gate;

a second PMOS transistor where a drain of the first PMOS transistor is connected to a source;

a resistor where one terminal is connected to a gate and a drain of the second PMOS transistor and another terminal is grounded;

a second inverting gate for receiving a voltage divided by the resistor and the first and second PMOS transistors to generate the voltage level detection signal; and a condenser being connected between an output of the second inverting gate and a ground.

8. The data output buffer as claimed in claim 1, wherein the preset signal generation means includes:

first delay means for delaying the control signal for a first selected time when the control signal becomes a first voltage level;

second delay means for delaying the control signal for a second selected time longer than the first time to generate an inverted delayed control signal when the control signal becomes a first voltage level before it becomes a second level; and a NOR gate for receiving output signals from the first and second delay means to generate a logic-NORed edge 2signal.

9. The data output buffer as claimed in claim 1, wherein the output driver control means includes:

a pull up driver control portion for controlling the pull up driver to supply a power voltage to the output pad during a pulse of the output signal generated from the preset signal generation means, if the voltage level of the output pad detected through the voltage level detection means, is lower than the reference voltage level when the output buffer is disabled; and a pull down driver control portion for controlling the pull down driver to supply a ground voltage to the output pad during the pulse generated from the preset signal generation means, if the voltage level of the output pad detected through the voltage level detection means, is higher than the reference voltage level when the output buffer is disabled.

10. The data output buffer as claimed in claim 9, wherein the pull up driver control portion includes;

a first NAND gate for receiving the output signals from the voltage level detection means and the preset signal generation means;

a first inverting gate for inverting an output signal of the first NAND gate; and a NOR gate for receiving output signals from the first inverting gate and the pull up/down driver portion in the output driver means to generate a pull up driving signal to the control portion of the output driver means.

11. The data output buffer as claimed in claim 10, wherein the pull down driver portion includes:

a second inverting gate for inverting the output signal from the voltage level detection means;

a second NAND gate for receiving output signals from the second inverting gate and the preset signal generation means; and a third NAND gate for receiving output signals from the second NAND gate and the pull up/down driver portion in the output driver means to generate a pull down driving signal to the control portion of the output driver means.

* * * * *